US011069537B2

(12) United States Patent
Hadjikhani et al.

(10) Patent No.: US 11,069,537 B2
(45) Date of Patent: Jul. 20, 2021

(54) METHOD FOR DELIDDING A HERMETICALLY SEALED CIRCUIT PACKAGE

(71) Applicant: HAMILTON SUNDSTRAND CORPORATION, Charlotte, NC (US)

(72) Inventors: Ali Hadjikhani, East Hartford, CT (US); Michael R. Parent, Enfield, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/657,593

(22) Filed: Oct. 18, 2019

(65) Prior Publication Data
US 2021/0118695 A1 Apr. 22, 2021

(51) Int. Cl.
H01L 21/48 (2006.01)
B23K 26/38 (2014.01)
B23K 26/0622 (2014.01)

(52) U.S. Cl.
CPC ........ H01L 21/485 (2013.01); B23K 26/0624 (2015.10); B23K 26/38 (2013.01)

(58) Field of Classification Search
None
See application file for complete search history.

(56) References Cited

U.S. PATENT DOCUMENTS

| 4,521,668 | A | 6/1985 | Osial et al. |
| 6,602,430 | B1 | 8/2003 | Nally et al. |
| 7,170,029 | B2 | 1/2007 | Song et al. |
| 7,566,587 | B2 | 7/2009 | Lee |
| 8,643,181 | B2 | 2/2014 | Bae et al. |
| 9,780,054 | B2 | 10/2017 | Guzek et al. |
| 9,978,654 | B2 | 5/2018 | Lin et al. |
| 2005/0064682 | A1 | 3/2005 | Anderson |
| 2007/0075050 | A1 | 4/2007 | Heyl |
| 2019/0001442 | A1* | 1/2019 | Unrath ................. B23K 26/703 |
| 2020/0274319 | A1* | 8/2020 | Alapati ............... H01S 5/02276 |

FOREIGN PATENT DOCUMENTS

FR  2837733  10/2003

OTHER PUBLICATIONS

The Extended European Search Report for European Patent Application No. 19213650.5, dated Mar. 25, 2020.

* cited by examiner

Primary Examiner — Asok K Sarkar
(74) Attorney, Agent, or Firm — Carlson, Gaskey & Olds, P.C.

(57) ABSTRACT

A method of delidding an integrated circuit (IC) package includes directing a laser beam along a cut line of an integrated circuit package. The cut line defines a removable portion, the cutting occurs along the cut line, and the removable portion is removed after the directing. A method of troubleshooting an integrated circuit package is also disclosed.

20 Claims, 5 Drawing Sheets

US 11,069,537 B2

METHOD FOR DELIDDING A HERMETICALLY SEALED CIRCUIT PACKAGE

BACKGROUND

Integrated circuits (ICs) are often situated in hermetic packages. Inside this hermetic package resides a die, ball bonds, and bond wires, situated in a cavity formed in a body portion of the IC package. A lid seals the cavity in a body portion of the IC package. Occasionally, it may be useful to gain access to the die, ball bonds, and bond wires by removal of the lid. Removing the lid is referred to as "delidding."

One example method of delidding an IC package is by grinding and/or polishing away the lid to expose the cavity in the ceramic body containing the die, ball bonds, and bond wires. Another example method is using acid etching. However, IC packages can contain delicate hardware, such as the die, ball bonds, and bond wires. Some methods of delidding an IC package can damage this delicate hardware, and can be excessively time consuming.

SUMMARY

A method of delidding an integrated circuit (IC) package according to an example of this disclosure includes directing a laser beam along a cut line of an integrated circuit package. The cut line defines a removable portion, the cutting occurs along the cut line, and the removable portion is removed after the directing.

In a further example of the foregoing, the removable portion includes the lid.

In a further example of any of the foregoing, the lid includes a top surface, a side wall, and a foot portion which extends from the side wall. The cutting defines a cut surface through the foot portion.

In a further example of any of the foregoing, the lid includes a top surface and a side wall. The removable portion includes the top surface.

In a further example of any of the foregoing, the cutting defines a cut surface through the side wall.

In a further example of any of the foregoing, the lid defines a cavity therein, and the cavity is hermetically sealed by the lid.

In a further example of any of the foregoing, the laser beam is produced by a femtosecond laser in burst mode.

In a further example of any of the foregoing, the directing includes scanning the laser beam.

In a further example of any of the foregoing, the scanning includes an overlap per line of about 40% and 60%

In a further example of any of the foregoing, the scanning includes a pulse overlap of between about 50% and 80%.

In a further example of any of the foregoing, the scanning includes a line distance of between about 0.06 mm and 0.08 mm.

In a further example of any of the foregoing, a working distance for the laser is between about 70 mm and 90 mm.

In a further example of any of the foregoing, the directing includes moving or rotating at least one of the die and the laser beam.

In a further example of any of the foregoing, the integrated circuit package includes circuitry situated in a cavity that is covered by the lid, and further includes troubleshooting the circuit after removing the removable portion of the lid.

A method of troubleshooting an integrated circuit package according to an example of this disclosure includes delidding an integrated circuit package by laser cutting. The integrated circuit package contains circuitry situated in a cavity covered by a lid, and inspecting the circuit after the delidding.

In a further example of the foregoing, the laser cutting includes directing a laser beam along a cut line of the integrated circuit package. The cut line defines a removable portion, to cut along the cut line.

In a further example of any of the foregoing, the removable portion includes the lid.

In a further example of any of the foregoing, the lid includes a top surface, a side wall, and a foot portion which extends from the side wall. The cutting defines a cut surface through the foot portion.

In a further example of any of the foregoing, the lid includes a top surface and a side wall, and the removable portion includes the top surface.

In a further example of any of the foregoing, the cutting defines a cut surface through the side wall.

DETAILED DESCRIPTION

Figure 1B:
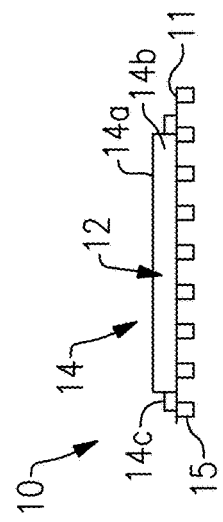
FIGS. 1A-B shows examples of an IC package.
Figure 1A:
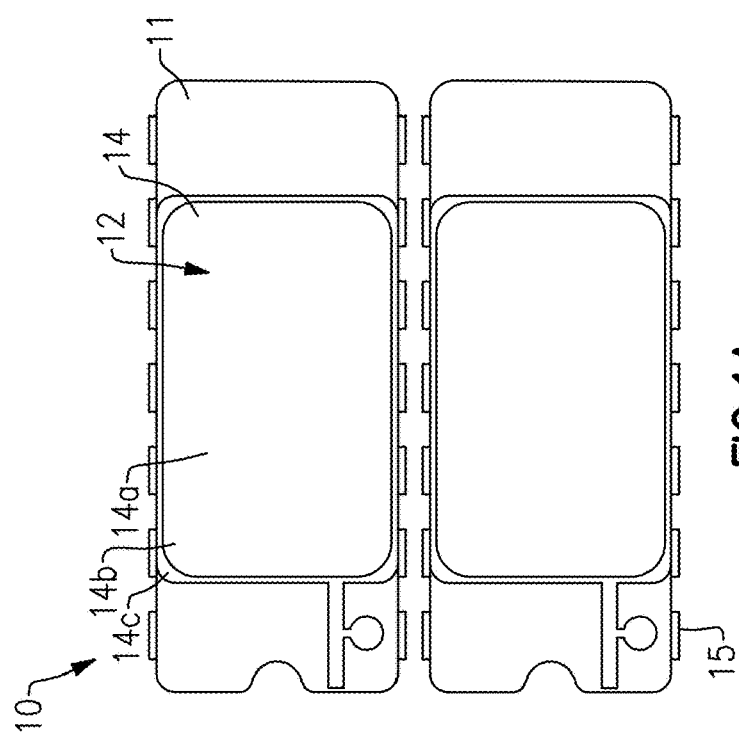

FIGS. 1A-B show an example integrated circuit ("IC") package 10. The IC package 10 includes a body portion 11. The body portion 11 includes a cavity 12 and a lid 14 that covers the cavity 12. Accordingly, the example IC package 10 of FIGS. 1A-B are known as "cavity ICs." The IC package 10 includes one or more device pins 15 (FIG. 1B) for connecting the IC package 10 to a printed wiring board (PWB) (not shown).

In one example, the IC package 10 is a dual in-line package (DIP).

The lid 14 includes a top surface 14a and side walls 14b. In some examples, the lid 14 also includes a foot portion 14c that extends out from the side walls 14b along some extend of the body portion 11. The cavity 12 is hermetically sealed by the lid 14. In one example, the lid 14 is attached to the portion 11 at the foot section 14c. In another example, the foot section 14c is omitted, and the lid 14 is attached to the body portion 11 along a perimeter of the side walls 14b.

In some examples, the body portion 11 of the IC package 10 comprises a ceramic-based material, and the lid 14 comprises a metallic-based material, such as lead, tin, or a mixture thereof. The attachment of the lid 14 and body portion 11 discussed above can be any suitable attachment method for the respective materials that enables a hermetic seal, such as welding, brazing, gluing, or other methods.

In the example shown, the lid 14 is generally rectangular, though other shapes are contemplated.

Figure 2:
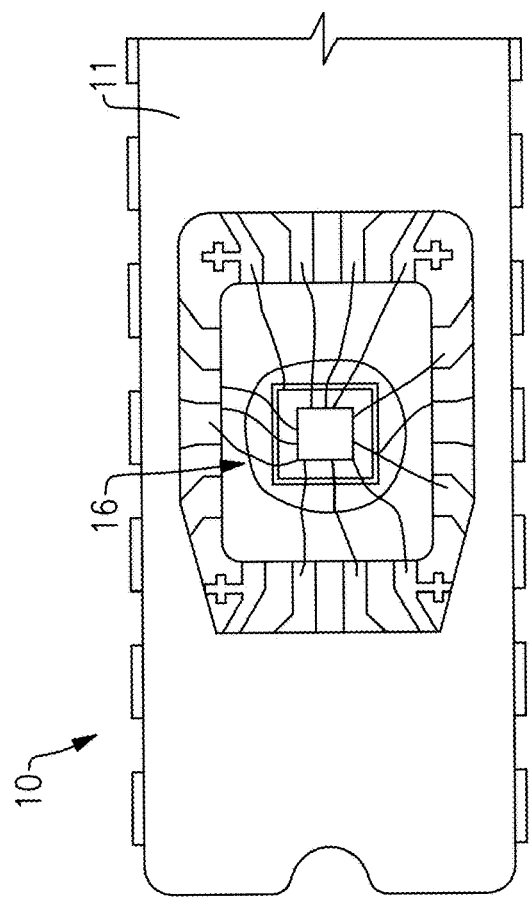
FIG. 2 shows an example of an IC package that is delidded.

FIG. 2 shows an example IC package 10 that is "delidded," e.g., the lid 14 has been removed. As shown, the IC package 10 contains circuitry 16 situated in the cavity 14, including in some examples a die, ball bonds and bond wires, or other features as would be known in the art. The circuitry 16 enables the IC package 10 to perform a computing function for the PWB as would be known in the art. In one example, the PWB is included in a device of a gas turbine engine.

Occasionally, an IC package 10 is delidded in order to gain access to the circuitry 16 therein. For example, the IC package 10 may exhibit a malfunction. Root cause analysis and troubleshooting the malfunction may require physical access to the circuit 16 in order to study its individual components and identify malfunctions thereof. For instance, troubleshooting may include visually (or microscopically) inspecting the circuitry 16 for signs of burning, electrical overstress, broken/disconnected parts, or other issues.

Figure 3A:
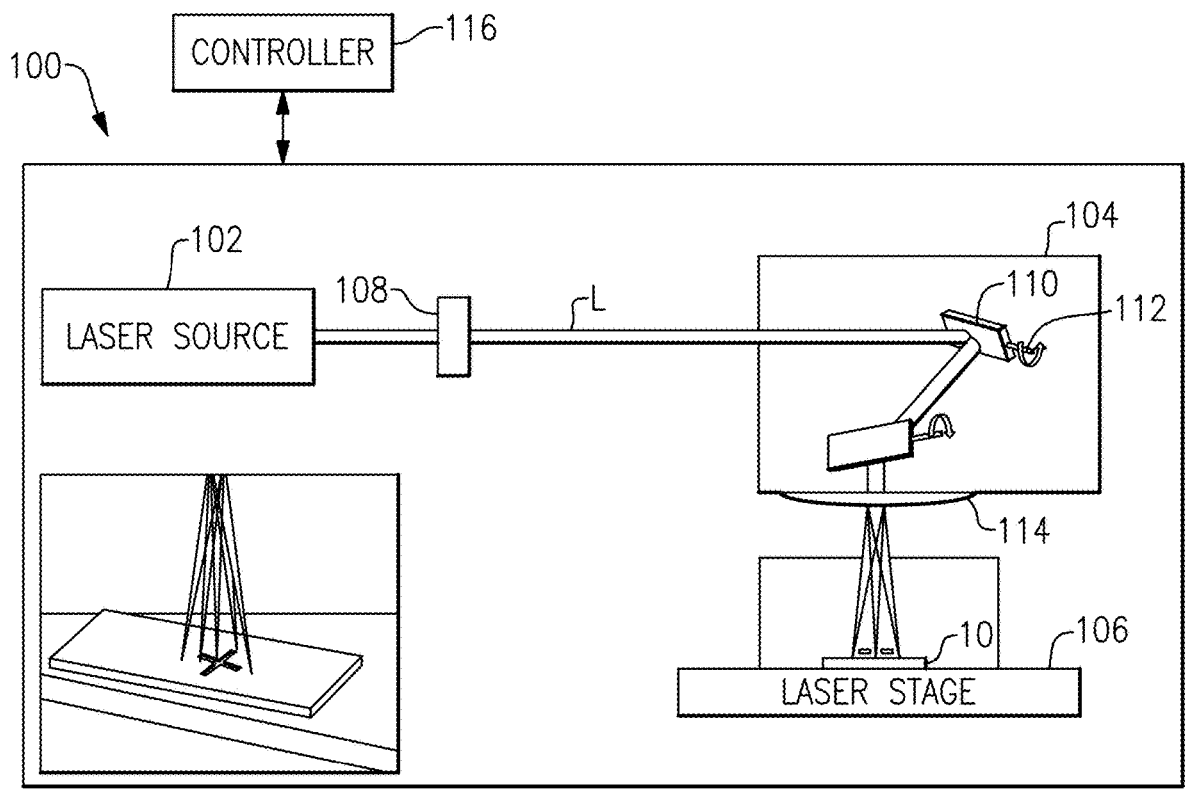
FIG. 3A schematically shows an example laser setup.

One way to delid an IC package 10 is to laser-cut the lid 14 so that it can be removed. FIG. 3A shows an example laser apparatus 100 for laser-cutting the lid 14. The example laser apparatus 100 includes a laser source 102, a scan head 104, and a laser stage 106. In one example, the laser source 102 is a femtosecond laser source 102, which emits optical pulses with a duration on the order of femtoseconds. In a more particular example, the laser is a 130 femtosecond laser source 102, e.g., it emits optical pulses with a duration of 130 femtoseconds. The laser source 102 can be operated in a burst mode, in one example. In the burst mode, an output from the laser source 102 is limited by the heat capacity of the laser medium. The laser source 102 operates until the medium reaches a maximum acceptable temperature ("burst" or "pulse"), then shuts off and is cooled before repeating the burst. In a particular example, the energy per burst of a laser beam L produced by the laser source is between about 3 and 3.5 micro Jules. In a more particular example, the energy per burst is about 3.2 micro Jules. In one example, the rate of the bursts is 0.5 MHz.

One or more beam expanders 108 are situated between the laser source 102 and scan head 104 to expand the size of the beam L from the laser 102 according to any known method and associated apparatus. One or more mirrors 110, such as galvo-mirrors, are situated in the scan head 104. The mirrors 110 are positioned on pivots 112 so that the mirrors 110 are rotatable. The mirrors 110 direct the beam L to a lens 114, such as an f-theta lens. The lens 114 directs the laser beam L to a component in the laser stage 106. In this example, the component is an IC package 10.

In one example, the laser apparatus 100 includes a controller 116 that is operable to control one or more of the laser source 102, the scan head 104, the beam expanders 108, and the pivots 112 as would be known in the art.

In some examples, the laser apparatus 100 includes an air flow generator such as a fan (not shown) to further remove any heat generated during the process.

Figure 4:
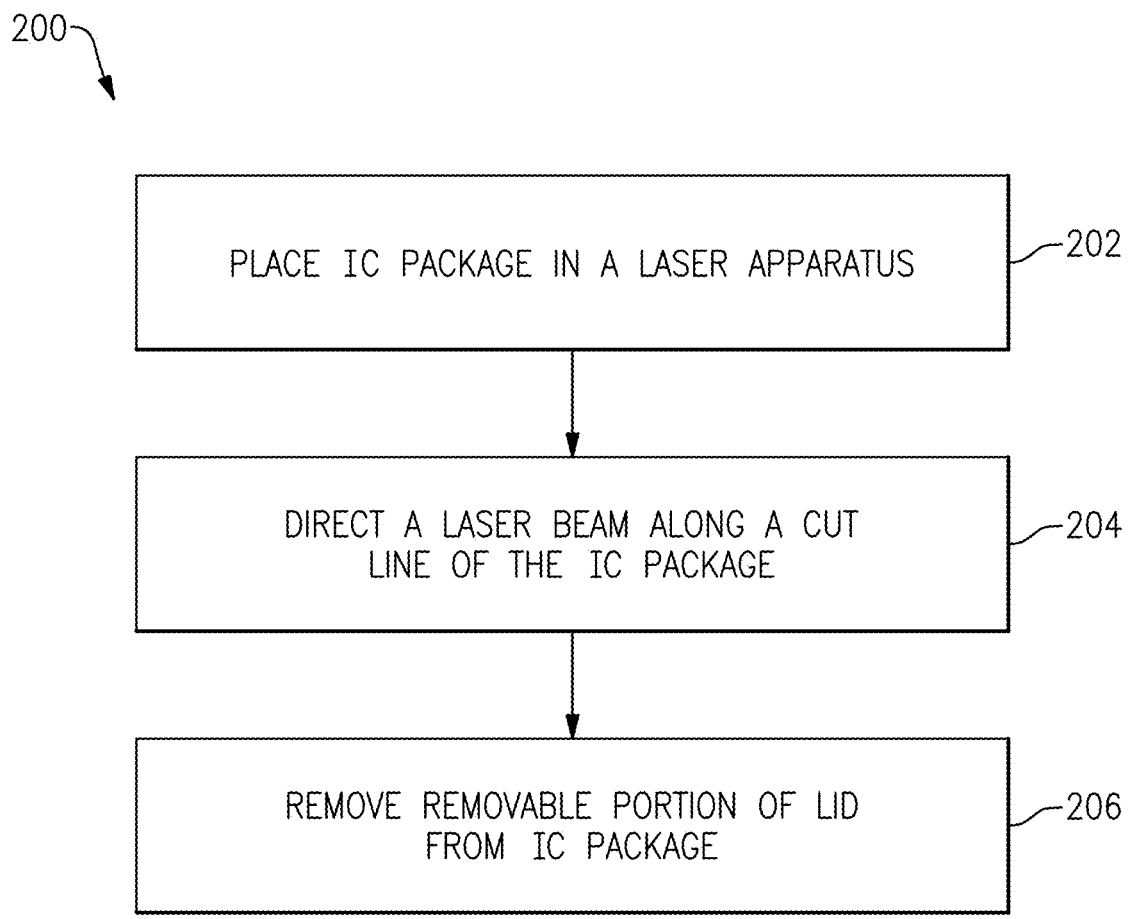
FIG. 4 schematically shows a method of delidding an IC package by laser cutting.

A method 200 of delidding an IC package 10 by laser cutting is shown in FIG. 4. The method includes the following steps.

In step 202, an IC package 10 is placed in a laser apparatus 100, and in particular in a laser stage 106 of the apparatus 100.

Figure 5A:
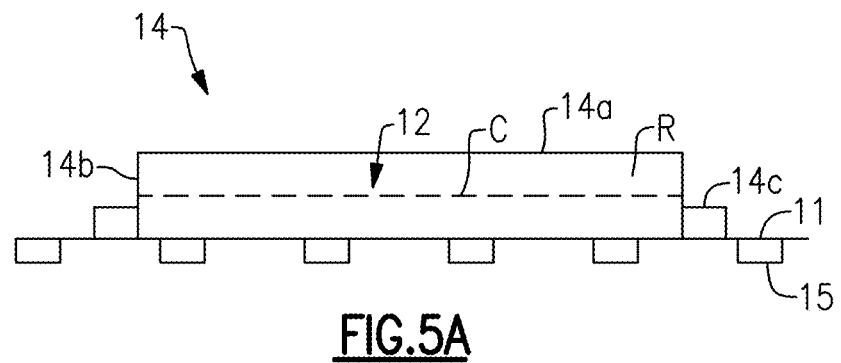
FIG. 5A-B show example cut lines for delidding an IC package by laser cutting.
Figure 5B:
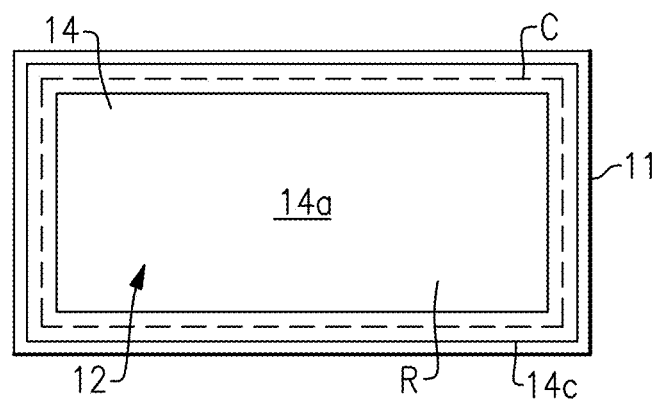

In step 204, the laser is directed along a cut line of the IC package 10 by the mirrors 110 and lens 114 as discussed above. The cut line C defines a removable portion R of the IC package 10. Cutting along the cut line C defines a cut surface. FIGS. 5A-B show example cut lines C. In FIG. 5A, cut line C is through the side wall 14b of the lid 14 and around the perimeter of the lid 14, e.g., the cutting defines a cut surface that is is generally parallel to the body portion 11. In this example "generally parallel" includes a slight angle of about 15 degrees of less with respect to the body portion 11. In this example, the removable portion R includes the top surface 14a of the lid 14. In FIG. 5B, the cut line C is along the foot portion 14c of the lid 14 around the perimeter of the lid 14, e.g., cutting along the cut line C defines a cut surface that is perpendicular to the body portion 11. In this example, the removable portion R includes the entire lid 14, including the side walls 14b. The cut line C may be selected depending on the attachment of the lid 14 to the body portion 11, discussed above. In one example, the laser beam L is directed along the cut line C at an angle that is perpendicular to the cut line C, though other angles may be contemplated.

Figure 3B:
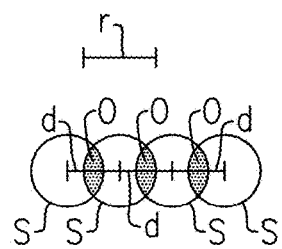
FIG. 3B schematically shows a scanning pattern for the laser apparatus of FIG. 3A.

The directing includes scanning the laser beam L along the cut line. As is schematically shown in FIG. 3B, the laser beam L produces a circular spot S with a radius r. The spot size S is related to the radius of the laser beam L at the laser source 102, and the focal length, which is related to working distance for the laser apparatus 100 (the distance between the scan head 104 and the laser stage 106). Also the greater the working distance, the larger the radius r of the spot S. In one example, the radius r is between about 13 and 70 microns and the working distance is between about 85 and 88 mm. In a particular example, the radius r is about 50 microns and the working distance is about 85.5 mm.

For example, FIG. 3B shows four spots S. "Scanning" includes producing these successive spots S along the cut line C. The successive spots S overlap by an overlap O. In one example, the overlap between spots S is between about 50 and 80% of the size of the spots S, which is known as a "pulse overlap." In a more particular example, the pulse overlap is 70%. In one example, a distance d between center points of successive spots S is about 0.07 mm, which is known as "line distance." The pulse overlap and line distance are related to an "overlap per line" which corresponds to an effective amount of overlap along the length of the cut line C caused by the scanning. In one example, the overlap per line is between about 40% and 60%. In a more particular example, the overlap per line is about 50%.

In one example, the directing may include (in addition to the scanning) rotating or moving the IC package 10 on the laser stage 106. In another example, the directing includes rotating or moving the laser stage 106, and the IC package 10 remains stationary on the laser stage 106. In another example, the directing only includes directing the laser beam L by the mirrors 110 and lens 114, and the IC package 10 and laser stage 106 remain stationary. Any combination of these examples is also contemplated, e.g., rotating/moving the IC package 10 and/or the laser stage 106 and/or directing the laser 106 by the lens 114. The directing can be controlled by controller 116 in some examples.

In step 208, the removable portion is defined by the cut line C is removed from the IC package 10.

Figure 6A:
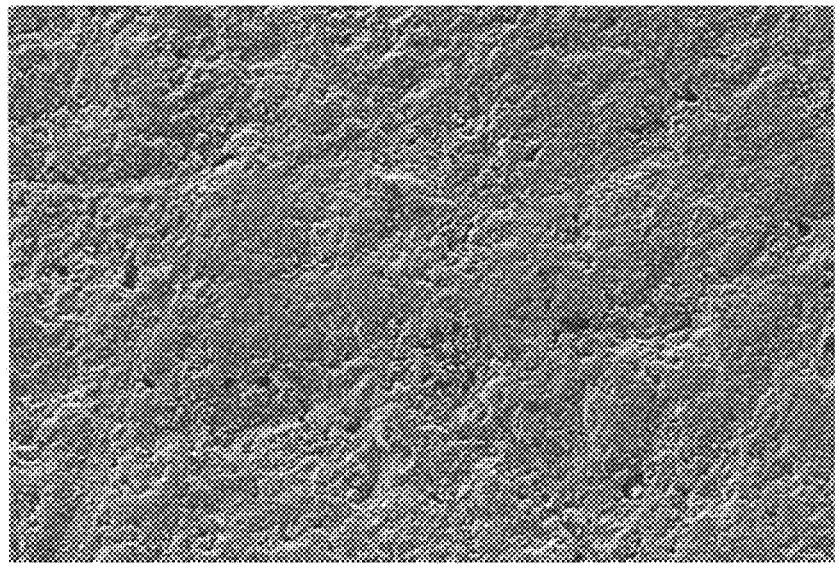
FIGS. 6A-B show scanning electron microscopy images (SEM) images of a patterned surface before and after cutting with the laser apparatus, respectively.
Figure 6B:
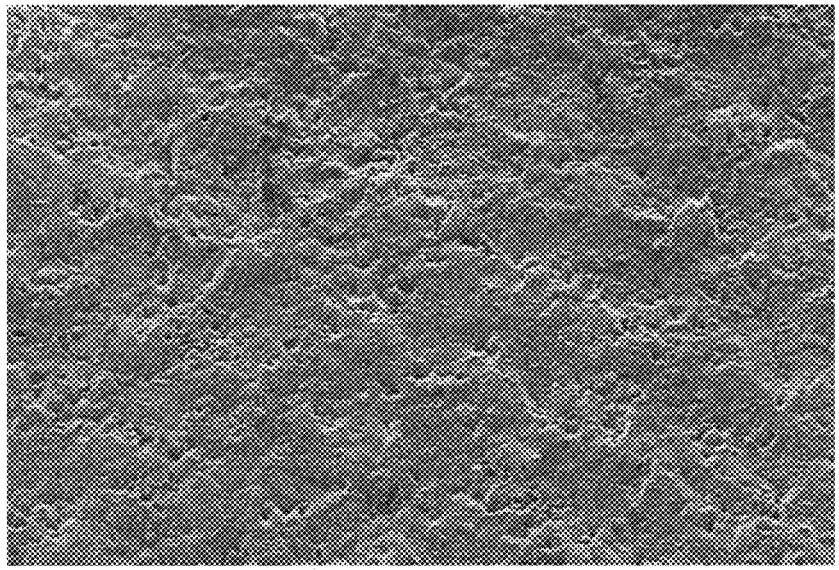

The laser cutting according to the method 200 described above results in a clean, defined cut edge that minimally disrupts surrounding material of the body portion 11. The minimal disruption includes minimal heat dissipation from the laser beam L to material of the body portion 11 surrounding the cut line C. FIGS. 6A-B show scanning electron microscope images of an example body portion 11 before laser cutting according to the method discussed above (FIG. 6A) and after laser cutting according to the method discussed above (FIG. 6B). FIG. 6B is more magnified than FIG. 6A. As shown, the material of the body portion 11 exhibits minimal disruption after cutting according to the method 200 described above.

Because the laser cutting according to the method 200 has such minimal disruption to surrounding material and since the circuitry 16 is in a cavity untouched by the laser beam, the circuitry 16 is minimally damaged or changed by the laser cutting. Accordingly, the circuitry 16 remains in substantially the same state as before the delidding even after the delidding. Therefore, in the case of IC package 10 malfunction, the circuitry 16 can be observed in substantially the same state in which it malfunctioned, better enabling determination of the reason for malfunction and root cause analysis. On the other hand, other methods of delidding, such as grinding away the lid 14 or cutting the lid 14 with a mechanical tool such as a razor blade are exceedingly time consuming and may cause damage to or change the circuit 16 in the process of delidding.

Additionally, the laser cutting according to the method 200 is relatively fast. In one example, an IC package 10 can be delidded on the order of minutes, for instance 10 minutes. On the other hand, the other example methods of grinding or cutting with a mechanical tool can take several hours.

The foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A method of delidding an integrated circuit (IC) package, comprising:
   directing a laser beam along a cut line of an integrated circuit package, wherein the integrated circuit package includes a body and a lid, the lid defining a cavity therein, and wherein the lid includes a side wall extending from the body to a top surface, the top surface opposed from the body, the cut line defining a removable portion, wherein the removable portion includes the top surface of the lid;
   cutting along the cut line; and
   removing the removable portion after the directing.

2. The method of claim 1, wherein the removable portion includes the lid.

3. The method of claim 2, wherein the lid includes a foot portion extending from the side wall along the body, and wherein the cutting defines a cut surface through the foot portion.

4. The method of claim 3, wherein the cutting is perpendicular to the body.

5. The method of claim 1, wherein the cutting defines a cut surface through the side wall.

6. The method of claim 5, wherein the cutting is parallel to the body.

7. The method of claim 1, wherein the cavity is hermetically sealed by the lid.

8. The method of claim 1, wherein the laser beam is produced by a femtosecond laser in burst mode.

9. The method of claim 8, wherein the directing includes scanning the laser beam.

10. The method of claim 9, wherein the scanning includes an overlap per line of about 40% and 60%.

11. The method of claim 10, wherein the scanning includes a pulse overlap of between about 50% and 80%.

12. The method of claim 11, wherein the scanning includes a line distance of between about 0.06 mm and 0.08 mm.

13. The method of claim 8, wherein a working distance for the laser is between about 70 mm and 90 mm.

14. The method of claim 1, wherein the directing includes moving or rotating at least one of the integrated circuit package and the laser beam.

15. The method of claim 14, wherein the integrated circuit package includes circuitry situated in the cavity, and further comprising troubleshooting the circuitry after removing the removable portion of the lid.

16. The method of claim 1, wherein the laser beam is directed perpendicular to the cut line.

17. A method of troubleshooting an integrated circuit package, comprising:
   delidding an integrated circuit package by laser cutting to define a removable portion, wherein the integrated circuit package contains circuitry situated in a body of the integrated circuit package, the cavity covered by a lid, wherein the lid includes a side wall extending from the body to a top surface, the top surface opposed from the body, and the removable portion includes the top surface; and
   inspecting the circuit after the delidding.

18. The method of claim 17, wherein the laser cutting includes directing a laser beam along a cut line of the integrated circuit package, the cut line defining a removable portion, to cut along the cut line.

19. The method of claim 17, wherein the lid includes a foot portion extending from the side wall, and wherein the cutting defines a cut surface through the foot portion.

20. The method of claim 17, wherein the cutting defines a cut surface through the side wall.

* * * * *